United States Patent
Horikawa et al.

(10) Patent No.: US 8,748,325 B2
(45) Date of Patent: Jun. 10, 2014

(54) METHOD OF MANUFACTURING SEMICONDUCTOR DEVICE

(71) Applicant: Elpida Memory, Inc., Tokyo (JP)

(72) Inventors: Mitsuhiro Horikawa, Tokyo (JP); Hiroyuki Ode, Tokyo (JP); Masashi Haruki, Hiroshima (JP); Shigeki Takishima, Hiroshima (JP); Shinichi Kihara, Hiroshima (JP)

( * ) Notice: Subject to any disclaimer, the term of this patent is extended or adjusted under 35 U.S.C. 154(b) by 0 days.

(21) Appl. No.: 13/782,300

(22) Filed: Mar. 1, 2013

(65) Prior Publication Data

US 2014/0038424 A1    Feb. 6, 2014

(30) Foreign Application Priority Data

Aug. 2, 2012   (JP) ................................. 2012-172344

(51) Int. Cl.
*H01L 21/8238* (2006.01)
*C08G 73/10* (2006.01)

(52) U.S. Cl.
USPC ........ 438/780; 438/778; 525/432; 428/473.5; 528/170; 528/172

(58) Field of Classification Search
None
See application file for complete search history.

(56) References Cited

U.S. PATENT DOCUMENTS 5,952,448 A * 9/1999 Lee et al. ...................... 528/170
2010/0304160 A1 * 12/2010 Fukukawa et al. ............ 428/458

FOREIGN PATENT DOCUMENTS

JP    1-163203    6/1989
JP    2000-003910   1/2000

* cited by examiner

*Primary Examiner* — Michael Trinh
*Assistant Examiner* — Pamela E Perkins
(74) *Attorney, Agent, or Firm* — Young & Thompson (57) ABSTRACT

A polyimide film is effectively formed on a complicated surface. The polyimide film is formed by reacting, on the surface, diamine monomer and tetracarboxylic acid dianhydride monomer both of which are dissolved within carbon dioxide in a supercritical states, together with a polyamic acid resulting from a reaction between the diamine monomer and the tetracarboxylic acid dianhydride reached to the surface.

15 Claims, 7 Drawing Sheets

FIG. 12

METHOD OF MANUFACTURING SEMICONDUCTOR DEVICE

This application is based upon and claims the benefit of priority from Japanese patent application No. 2012-172344, filed on Aug. 2, 2012, the disclosure of which is incorporated herein in its entirety by reference.

BACKGROUND OF THE INVENTION

1. Field of the Invention

The present invention relates to a method of manufacturing a semiconductor device.

2. Description of the Related Art

Polyimide is an excellent material in mechanical strength, thermal stability, and electrical insulating properties. Therefore, utilization is expected as an insulating material, a sealing material, a protective film, and the like in a semiconductor field and other various fields. As for a method of forming a polyimide film, known is a method, wherein imidization is induced by applying a solution of precursor polyamic acid to a substrate and performing drying and a heat treatment.

Herein, it is to be noted that concave portions with large aspect ratios and the like are often present on the surface of the substrate including a semiconductor element. It is difficult to allow the solution of polyamic acid to enter or guide the concave portions with large aspect ratios uniformly by the method in which the solution of polyamic acid is applied. As a result, voids are very often generated in the polyimide film.

Another method is also known, wherein a pressure is applied and, thereby, the solution of polyamic acid is allowed to enter the concave portions. However, a pressure is locally applied to a semiconductor substrate, so that an element may be damaged. Even if the solution of polyamic acid is allowed to fill, it is difficult to ensure a required film thickness because of reduction in volume due to vaporization of an organic solvent. In addition, bubbles may be generated in vaporization of the organic solvent and a load on the environment may be heavy because a large amount of organic solvent is vaporized.

Meanwhile, in recent years, attention has been directed to a technology, wherein a plurality of semiconductor substrates are three-dimensionally stacked. However, it is necessary that an insulating material is filled in between the stacked semiconductor substrates. At present, a side-fill method is used, wherein an epoxy based resin is poured in from a chip end portion taking advantage of capillarity. However, the suitability for mass production is poor because of a long treatment time, and there are problems from the viewpoint of the heat resistance and the mechanical strength. Polyimide has suitability as a filling material. However, in the case where, for example, silicon wafers having a diameter of 300 mm are stacked at an interval or a gap of 5 to 10 µm, it is substantially impossible for the conventional method by using an organic solvent to fill a polyimide film into such a wide region with a small interval or gap.

A vapor deposition polymerization method has been studied as a method for forming a polyimide film without using an organic solvent (refer to Japanese Unexamined Patent Application Publication No. 2000-3910, for example). In the vapor deposition polymerization method, a raw material monomer is vaporized and is supplied to a substrate surface and, then, polymerization is induced.

In addition, it has been studied to form an acrylic polymer by using carbon dioxide in a supercritical state as a solvent (refer to Japanese Unexamined Patent Application Publication No. 01-163203, for example). Meanwhile, the present inventors found that diamine and tetracarboxylic acid dianhydride were able to be dissolved into carbon dioxide in a supercritical state (refer to Naoya Fukui, Fumiya Kobayashi, Masashi Haruki, Shin-ichi Kihara, Shigeki Takishima "12th SCEJ Students Meeting Preprint" p 9, 2010, for example).

However, the vapor deposition polymerization method is not suitable for mass production because diamine and tetracarboxylic acid dianhydride serving as raw materials for the polyimide have low sublimation pressures (vapor pressures) even at high temperatures, so that the amount of supply of raw material monomers is reduced to a low level and the film formation rate is very low. In addition, polymerization of the raw material monomers occurs even at room temperature, and when two raw material monomers are mixed, a polyamic acid is generated. The polyamic acid has a very low sublimation pressure and is precipitated immediately. Therefore, it is substantially difficult to supply the generated polyamic acid in a vapor phase to the substrate surface. As described above, it is impossible to fill fine concave portions and gaps by the method in which precipitated polyamic acid is accumulated.

Meanwhile, Japanese Unexamined Patent Application Publication No. 01-163203 discloses that an acrylic polymer is formed by using carbon dioxide in a supercritical state as a solvent, although the material is different from polyimide, and the properties are different.

SUMMARY OF THE INVENTION

Accordingly, the present invention seeks to solve at least one of the above-described problems and to ensure the possibility of forming a polyimide film in a fine concave portion or a gap by using carbon dioxide in a supercritical state as a solvent.

According to the present disclosure, there is provided a method of forming a polyimide film on a surface of a substrate placed in a reaction chamber, the method including the steps of supplying a diamine monomer dissolved in carbon dioxide in a supercritical state and a tetracarboxylic acid dianhydride monomer dissolved in carbon dioxide in a supercritical state through independent supply paths, performing mixing in the vicinity of the substrate, and reacting the diamine monomer, the tetracarboxylic acid dianhydride monomer, and polyamic acid resulting from the reaction of the diamine monomer and the tetracarboxylic acid dianhydride monomer, which are dissolved in carbon dioxide in a supercritical state and which reach the surface of the substrate, on the surface of the substrate.

In the method for forming a polyimide film, according to the present disclosure, the temperature of the surface of the substrate may be specified to be higher than or equal to a temperature at which imidization occurs, the temperature of the atmosphere in the reaction chamber may be specified to be higher than or equal to a temperature at which carbon dioxide comes into a supercritical state and lower than the temperature at which imidization occurs, and the pressure in the reaction chamber may be specified to be more than or equal to a pressure at which carbon dioxide comes into a supercritical state.

In the method for forming a polyimide film, according to the present disclosure, the substrate may be placed with a film-forming surface, on which the polyimide film is to be formed, down, and the diamine monomer dissolved in carbon dioxide in a supercritical state and the tetracarboxylic acid dianhydride monomer dissolved in carbon dioxide in a supercritical state may be supplied from below the substrate.

In the method for forming a polyimide film, according to the present disclosure, the substrate may be placed with a film-forming surface, on which the polyimide film is to be formed, down, a straightening vane may be disposed opposite to the film-forming surface of the substrate and parallel to the film-forming surface, and the diamine monomer dissolved in carbon dioxide in a supercritical state and the tetracarboxylic acid dianhydride monomer dissolved in carbon dioxide in a supercritical state may be introduced into a gap between the substrate and the straightening vane.

In the method for forming a polyimide film, according to the present disclosure, an outlet to discharge the diamine monomer dissolved in carbon dioxide in a supercritical state and an outlet to discharge the tetracarboxylic acid dianhydride monomer dissolved in carbon dioxide in a supercritical state may be disposed close to each other.

In the method for forming a polyimide film, according to the present disclosure, excess carbon dioxide in the reaction chamber may be exhausted from an exhaust hole disposed at a location higher than the substrate.

In the method for forming a polyimide film, according to the present disclosure, the diamine monomer and the tetracarboxylic acid dianhydride monomer may be dissolved into carbon dioxide in a supercritical state containing an aprotic polar solvent as a co-solvent.

In this case, the aprotic polar solvent may be any one of N,N-dimethylformamide, N,N-dimethylacetamide, N-methylpyrrolidone, N-methyl-2-pyrrolidone, hexamethylphosphoramide, 1,3-dimethylimidazolidinone, tetramethylurea, 1,3-dipropylimidazolidinone, N-methyl caprolactam, dimethyl sulfoxide, dimethyl sulfone, tetramethyl sulfone, acetone, and ethylene glycol, or a mixture of at least two thereof.

In the method for forming a polyimide film, according to the present disclosure, the temperature of the atmosphere in the reaction chamber may be specified to be 35° C. or higher and 100° C. or lower, the pressure in the reaction chamber may be specified to be 10 MPa or more and 40 MPa or less, and the temperature of the substrate surface may be specified to be 150° C. or higher and 500° C. or lower.

In the method for forming a polyimide film, according to the present disclosure, the diamine monomer may be 4,4'-diaminodiphenyl ether, and the tetracarboxylic acid dianhydride monomer may be pyromellitic acid anhydride.

A method for manufacturing a semiconductor device, according to the present disclosure, includes the steps of placing a substrate in a reaction chamber and forming a polyimide film on the surface of the substrate placed in the reaction chamber, wherein in the forming of a polyimide film, a diamine monomer dissolved in carbon dioxide in a supercritical state and a tetracarboxylic acid dianhydride monomer dissolved in carbon dioxide in a supercritical state are supplied from independent supply paths, mixing is performed in the vicinity of the substrate, and the diamine monomer, the tetracarboxylic acid dianhydride monomer, and polyamic acid resulting from the reaction of the diamine monomer and the tetracarboxylic acid dianhydride monomer reach the film-forming surface, while being dissolved in carbon dioxide in a supercritical state, and are reacted on the surface of the substrate.

In the forming of a polyimide film of the method for manufacturing a semiconductor device, according to the present disclosure, the temperature of the surface of the substrate may be specified to be higher than or equal to a temperature at which imidization occurs, the temperature of the atmosphere in the reaction chamber may be specified to be higher than or equal to a temperature at which carbon dioxide comes into a supercritical state and lower than the temperature at which imidization occurs, and the pressure in the reaction chamber may be specified to be more than or equal to a pressure at which carbon dioxide comes into a supercritical state.

In the forming of a polyimide film of the method for manufacturing a semiconductor device, according to the present disclosure, the substrate may be placed with a film-forming surface, on which the polyimide film is to be formed, down, and the diamine monomer dissolved in carbon dioxide in a supercritical state and the tetracarboxylic acid dianhydride monomer dissolved in carbon dioxide in a supercritical state may be supplied from below the substrate.

In the forming of a polyimide film of the method for manufacturing a semiconductor device, according to the present disclosure, the substrate may be placed with a film-forming surface, on which the polyimide film is to be formed, down, a straightening vane may be disposed opposite to the film-forming surface of the substrate and parallel to the film-forming surface, and the diamine monomer dissolved in carbon dioxide in a supercritical state and the tetracarboxylic acid dianhydride monomer dissolved in carbon dioxide in a supercritical state may be introduced into a gap between the substrate and the straightening vane.

In the forming of a polyimide film of the method for manufacturing a semiconductor device, according to the present disclosure, an outlet to discharge the diamine monomer dissolved in carbon dioxide in a supercritical state and an outlet to discharge the tetracarboxylic acid dianhydride monomer dissolved in carbon dioxide in a supercritical state may be disposed close to each other.

In the forming of a polyimide film of the method for manufacturing a semiconductor device, according to the present disclosure, excess carbon dioxide in the reaction chamber may be exhausted from an exhaust hole disposed at a location higher than the substrate.

In the forming of a polyimide film of the method for manufacturing a semiconductor device, according to the present disclosure, polyamic acid may be removed from carbon dioxide exhausted from the exhaust hole.

In the forming of a polyimide film of the method for manufacturing a semiconductor device, according to the present disclosure, the concentration of the diamine monomer dissolved in carbon dioxide in a supercritical state and the concentration of the tetracarboxylic acid dianhydride monomer dissolved in carbon dioxide in a supercritical state may be maintained constant, and carbon dioxide in a supercritical state may be supplied and exhausted continuously in such a way that the flow rate of the carbon dioxide in a supercritical state becomes constant.

In the method for manufacturing a semiconductor device, according to the present disclosure, the method may further include the step of heat-treating the substrate at a temperature higher than or equal to the temperature at which imidization occurs after the forming of a polyimide film.

In the method for manufacturing a semiconductor device, according to the present disclosure, the substrate may be a stacked substrate in which a plurality of substrates are stacked with bumps therebetween, and through holes may be disposed in the lowest semiconductor substrate of the stacked substrate.

In the method for manufacturing a semiconductor device, according to the present disclosure, the method may further include the steps of preparing the substrate before the placing of a substrate in a reaction chamber and grinding the substrate after the forming of a polyimide film, wherein the preparing of the substrate may include stacking of a first substrate and a second substrate with a bump therebetween, the forming of a polyimide film may be forming of the polyimide film in such a way as to fill in between the first substrate and the second substrate, and the grinding of the substrate may include grinding the second substrate to reduce the thickness of the substrate and forming bumps on a ground surface of the second substrate.

In the method for manufacturing a semiconductor device, according to the present disclosure, the diamine monomer and the tetracarboxylic acid dianhydride monomer may be dissolved into carbon dioxide in a supercritical state containing an aprotic polar solvent as a co-solvent.

In this case, the aprotic polar solvent may be any one of N,N-dimethylformamide, N,N-dimethylacetamide, N-methylpyrrolidone, N-methyl-2-pyrrolidone, hexamethylphosphoramide, 1,3-dimethylimidazolidinone, tetramethylurea, 1,3-dipropylimidazolidinone, N-methyl caprolactam, dimethyl sulfoxide, dimethyl sulfone, tetramethyl sulfone, acetone, and ethylene glycol, or a mixture of at least two thereof.

In the method for manufacturing a semiconductor device, according to the present disclosure, the temperature of the atmosphere in the reaction chamber may be specified to be 35° C. or higher and 100° C. or lower, the pressure in the reaction chamber may be specified to be 10 MPa or more and 40 MPa or less, and the temperature of the substrate surface may be specified to be 150° C. or higher and 500° C. or lower.

In the method for manufacturing a semiconductor device, according to the present disclosure, the diamine monomer may be 4,4'-diaminodiphenyl ether, and the tetracarboxylic acid dianhydride monomer may be pyromellitic acid anhydride.

A polyimide film forming apparatus according to the present disclosure includes a reaction chamber, a substrate holder which is disposed in the inside of the reaction chamber and which holds the substrate with a film-forming surface down, a first supply path to supply a diamine monomer dissolved in carbon dioxide in a supercritical state to the film-forming surface, a second supply path to supply a tetracarboxylic acid dianhydride monomer dissolved in carbon dioxide in a supercritical state to the film-forming surface, a pressure control portion to control the pressure in the reaction chamber, an atmosphere temperature control portion to control the temperature of the atmosphere in the reaction chamber, and a substrate temperature control portion to control the temperature of the substrate, wherein the atmosphere temperature control portion specifies the temperature in the reaction chamber to be higher than or equal to a temperature at which carbon dioxide comes into a supercritical state and lower than a temperature at which imidization occurs, the pressure control portion specifies the pressure in the reaction chamber to be a pressure at which carbon dioxide comes into a supercritical state, the substrate temperature control portion specifies the temperature of the substrate to be higher than or equal to the temperature at which imidization occurs, an end of the first supply path and an end of the second supply path are disposed in the vicinity of the film-forming surface, the diamine monomer and the tetracarboxylic acid dianhydride monomer are mixed in the vicinity of the film-forming surface, and the diamine monomer, the tetracarboxylic acid dianhydride monomer, and polyamic acid resulting from the reaction of the diamine monomer and the tetracarboxylic acid dianhydride monomer reach the film-forming surface, while being dissolved in carbon dioxide in a supercritical state, and are reacted on the film-forming surface.

According to the method for forming a polyimide film of the present invention, carbon dioxide in a supercritical state is used as a solvent, and a polyimide film can be formed at a large film formation rate.

BRIEF DESCRIPTION OF THE DRAWINGS

The above features and advantages of the present invention will be more apparent from the following description of certain embodiments taken in conjunction with accompanying drawings, in which.

DESCRIPTION OF THE PREFERRED EMBODIMENTS

In a method for forming a polyimide film, according to the present embodiment, a diamine monomer dissolved in carbon dioxide in a supercritical state and a tetracarboxylic acid dianhydride monomer dissolved in carbon dioxide in a supercritical state are supplied through independent supply paths, mixing is performed in the vicinity of the substrate, and the diamine monomer, the tetracarboxylic acid dianhydride monomer, and polyamic acid resulting from the reaction of the diamine monomer and the tetracarboxylic acid dianhydride monomer reach the film-forming surface, while being dissolved in carbon dioxide in a supercritical state, and are reacted on the surface of the substrate.

In formation of the polyimide film according to the present embodiment, the diamine monomer and the tetracarboxylic acid dianhydride monomer are supplied to the surface of the substrate, while being dissolved in carbon dioxide in a supercritical state, and are reacted on the surface of the substrate. Carbon dioxide in a supercritical state has small surface tension and viscosity as compared with those of a common organic solvent and, therefore, enters even a narrow gap easily. Consequently, the diamine monomer and the tetracarboxylic acid dianhydride monomer can be supplied to a predetermined place of the substrate easily because of being dissolved in carbon dioxide in a supercritical state. The diamine monomer and the tetracarboxylic acid dianhydride monomer can be supplied at appropriate concentrations to between substrates stacked at a small interval. A polyimide film can be thereby filled into a narrow gap easily. For example, a polyimide film can be formed between substrates easily and serves as an underfill.

The diamine monomer and the tetracarboxylic acid dianhydride monomer are polymerized easily to form polyamic acid. Therefore, the diamine monomer and the tetracarboxylic acid dianhydride monomer are dissolved into carbon dioxide in a supercritical state and are supplied through independent supply paths to the vicinity of the substrate, and mixing is performed in the vicinity of the substrate. Generation of polyamic acid is started immediately after mixing of the diamine monomer and the tetracarboxylic acid dianhydride monomer, which are dissolved into carbon dioxide in a supercritical state. Consequently, the polyamic acid dissolved in carbon dioxide in a supercritical state is also supplied to the substrate surface.

The diamine monomer, the tetracarboxylic acid dianhydride monomer, and the polyamic acid are supplied to the surface of the substrate and are reacted on the surface of the substrate to form the polyamic acid having a higher molecular weight. The resulting polyamic acid is imidized (dehydration and ring closure), so that polyimide is generated. The reaction on the surface of the substrate is theoretically a two-step reaction in which polyamic acid is generated from the monomers and polyimide is generated from polyamic acid. However, it is believed that generation of polyamic acid occurs simultaneously with generation of polyimide.

That is, a diamine monomer dissolved in carbon dioxide in a supercritical state and a tetracarboxylic acid dianhydride monomer dissolved in carbon dioxide in a supercritical state are independently introduced to the vicinity of the substrate. Consequently, the diamine monomer and the tetracarboxylic acid dianhydride monomer are allowed to reach the substrate surface easily, while being dissolved in carbon dioxide in a supercritical state, and react on the substrate surface. Meanwhile, as for the polyamic acid generated by polymerization of these raw material monomers, a relatively low molecular weight polyamic acid at an initial stage has especially large solubility in carbon dioxide in a supercritical state as compared with that in the vapor deposition polymerization method. This fact is utilized. Polyamic acid is allowed to reach the substrate surface easily, while being dissolved in carbon dioxide in a supercritical state, and react on the substrate surface to obtain a polyimide film. Consequently, it is made possible to supply sufficient raw material monomers and polyamic acid to a gap with a small width. At this time, part of polyamic acid may be precipitated.

Solvent

In the method for forming a polyimide film, according to the present embodiment, carbon dioxide in a supercritical state is used as a solvent to dissolve monomers. Carbon dioxide in a supercritical state can dissolve the diamine monomer and the tetracarboxylic acid dianhydride monomer at high concentrations. Therefore, the amount of supply of monomers can be increased to about 150 to 1,500 times that in the case of the vapor deposition polymerization method, the molecular weight of the polyimide film can be increased, and the film formation rate can be improved to a great extent. In addition, carbon dioxide is a gas at ambient temperature and normal pressure and is employed as a solvent, so that the solvent is removed easily and a load on the environment can be reduced.

When the condition of carbon dioxide is returned to ambient temperature and normal pressure after the polyimide film is formed, carbon dioxide returns to a gas state and, therefore, desolvation (removal of carbon dioxide) can be performed easily after the polyimide film is formed. It is not necessary to use a large amount of organic solvent, so that a load on the environment can be reduced to a low level.

The supercritical state refers to a state in which a substance is present under a temperature and a pressure exceeding a critical point in a phase diagram and, therefore, a state in which a substance has a high density like a liquid while having fluidity like a gas, that is, a substance has properties of both a gas and a liquid. In the supercritical state of carbon dioxide, the temperature is 31.1° C. or higher and the pressure is 7.4 MPa or more.

Carbon dioxide in a supercritical state is used as the solvent and, thereby, the substrate is exposed to a high-pressure environment. However, the pressure is not applied locally, so that even in the case where semiconductor elements and the like are disposed on the substrate, a large damage can be avoided.

The solvent may be only carbon dioxide in a supercritical state, but a co-solvent may be contained. The solubility of the monomer can be enhanced by adding the co-solvent. Preferably, the co-solvent is specified to be an aprotic polar solvent. Specifically, any one of N,N-dimethylformamide (DMF), N,N-dimethylacetamide, N-methylpyrrolidone, N-methyl-2-pyrrolidone, hexamethylphosphoramide, 1,3-dimethylimidazolidinone, tetramethylurea, 1,3-dipropylimidazolidinone, N-methyl caprolactam, dimethyl sulfoxide, dimethyl sulfone, tetramethyl sulfone, acetone, and ethylene glycol can be used. Among them, N,N-dimethylformamide, N,N-dimethylacetamide, N-methylpyrrolidone, and N-methyl-2-pyrrolidone are preferable and N,N-dimethylformamide is more preferable. These co-solvents may be used alone or in combination.

The amount of co-solvent is preferably larger from the viewpoint of the solubility of the monomer. Specifically, the percent by mole of the co-solvent is preferably 5 percent by mole or more, more preferably 10 percent by mole or more, and further preferably 15 percent by mole or more. From the viewpoint of a load on the environment, a smaller percent by mole is preferable, so that 50 percent by mole or less is preferable, 40 percent by mole or less is more preferable, and 30 percent by mole or less is further preferable. In this regard, the percent by mole of the co-solvent is a value defined by mole number of co-solvent/mole number of mixed fluid (carbon dioxide+co-solvent+monomer)×100.

A small amount of organic solvent added as the co-solvent can be removed easily together with supercritical carbon dioxide after film formation. After film formation, the organic solvent can be removed almost completely by cleaning with supercritical carbon dioxide not containing a co-solvent.

Diamine Monomer

Any diamine monomer may be employed insofar as polyimide can be formed. Specific examples of usable diamine monomers include 1,4-diaminobenzene, 1,3-diaminobenzene, 2,4-diaminotoluene, 4,4'-diaminodiphenylmethane, 4,4'-diaminodiphenyl ether, 3,4'-diaminodiphenyl ether, 3,3'-dimethyl-4,4'-diaminobiphenyl, 2,2'-dimethyl-4,4'-diaminobiphenyl, 3,7-diamino-dimethyldibenzothiophene-5,5'-dioxide, 4,4'-diaminobenzophenone, 3,3'-diaminobenzophenone, 4,4'-bis(4-aminophenyl)sulfide, 4,4'-diaminodiphenylsulfone, 4,4'-diaminobenzanilide, 1,n-bis(4-aminophenoxy)alkane, 1,3-bis(4-aminophenoxy)-2,2'-dimethylpropane, 1,2-bis(2-(4-aminophenoxy)ethoxy)ethane, 9,9-bis(4-aminophenyl)fluorene, 5(6)-amino-1-(4-aminomethyl)-1,3,3-trimethylindane, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, 4,4'-bis(3-aminophenoxy)biphenyl, 2,2-bis(4-aminophenoxyphenyl)propane, bis[4-(4-aminophenoxy)phenyl]sulfone, bis[4-(3-aminophenoxy)phenyl]sulfone, 3,3'-dicarboxy-4,4'-diaminodiphenylmethane, 4,6-dihydroxy-1,3-phenylenediamine, 3,3'-dihydroxy-4,4'-diaminobiphenyl, 3,3',4,4'-tetraminobiphenyl, 1,6-diaminohexane, 1,3-bis(3-aminopropyl)-1,1,3,3-tetramethyldisiloxane, 1-amino-3-aminomethyl-3,5,5-trimethyldicyclohexane, 4,4'-methylenebis(4-cyclohexylamine), 1,4-diaminocyclohexane, bicyclo[2,2,1]heptanebis(methylamine), tricyclo[3,3,1,1,3,7]decane-1,3-diamine, 4-aminobenzoic acid-4-aminophenyl ester, 2-(4-aminophenyl)-5-aminobenzoxazole, 9,9-bis[4-(4-aminophenoxy)phenyl]fluorene, 2,2'-bis(3-sulfopropoxy)-4,4'-diaminobiphenyl, and 4,4'-bis(4-aminophenoxy)biphenyl-3,3'-disulfonic acid. These monomers may be used alone or in combination. Among them, 4,4'-diaminodiphenyl ether is preferable.

Tetracarboxylic Acid Dianhydride Monomer

Any tetracarboxylic acid dianhydride monomer may be employed insofar as polyimide can be formed by a reaction with the diamine monomer. Specific examples of usable tetracarboxylic acid dianhydride monomers include 1,2,4,5-benzenetetracarboxylic acid dianhydride (pyromellitic acid anhydride), oxydiphthalic acid dianhydride, biphenyl-3,4,3',4'-tetracarboxylic acid dianhydride, diphenylsulfone-3,4,3',4'-tetracarboxylic acid dianhydride, m(p)-terphenyl-3,4,3',4'-tetracarboxylic acid dianhydride, cyclobutane-1,2,3,4-tetracarboxylic acid dianhydride, 1-carboxymethyl-2,3,5-cyclopentanetricarboxylic-2,6:3,5-dianhydride, cyclohexane-1,2,4,5-tetracarboxylic acid dianhydride, butane-1,2,3,4-tetracarboxylic acid dianhydride, 4-phenylethylphthalic acid dianhydride, naphthalene-1,4,5,8-tetracarboxylic acid dianhydride, and bis(1,3-dioxo-1,3-dihydroisobenzofuran-5-carboxylic acid)1,4-phenylene. These monomers may be used alone or in combination. Among them, pyromellitic acid anhydride is preferable.

Substrate

Any material may be employed for the substrate, on which the polyimide film is to be formed. The substrates may be semiconductor substrates, e.g., silicon substrates, insulating substrates, e.g., sapphire substrates, and metal substrates, e.g., printed circuit boards and aluminum substrates. Semiconductor substrates, printed circuit boards, or the like may be stacked. A semiconductor substrate may be stacked on a printed circuit board. Semiconductor elements and other various structures may be disposed on the substrate. Through holes, concave portions, or the like may be disposed.

Film Formation Condition

The temperature of the atmosphere in the reaction chamber is specified to be a temperature at which carbon dioxide can come into a supercritical state and be lower than a temperature at which imidization occurs. The critical temperature of carbon dioxide is 31.1° C. and the temperature of the atmosphere in the reaction chamber is specified to be higher than or equal to this temperature. The temperature of the atmosphere in the reaction chamber is specified to be preferably 35° C. or higher, more preferably 40° C. or higher, and further preferably 50° C. or higher from the viewpoint of stable making of the critical state and induction of the reaction. Imidization occurs at a temperature of about 150° C. although depending on the type of the monomer. Therefore, the temperature of the atmosphere in the reaction chamber is specified to be lower than or equal to this temperature. The temperature is specified to be preferably 100° C. or lower, more preferably 80° C. or lower, and further preferably 70° C. or lower from the viewpoint of reliable suppression of imidization.

Imidization refers to a reaction in which dehydration and ring closure of polyamic acid occur and polyimide is generated. The term "temperature at which imidization occurs" indicates the lowest temperature at which imidization occurs stably in practice, that is, the temperature determined by adding a predetermined temperature to a temperature of start of imidization in order to ensure allowance. The temperature at which imidization occurs may be lowered by using a catalyst.

The pressure in the reaction chamber is specified to be a pressure at which carbon dioxide can come into a supercritical state. The critical pressure of carbon dioxide is 7.38 MPa and the pressure in the reaction chamber is specified to be more than or equal to this pressure. The pressure in the reaction chamber is specified to be preferably 10 MPa or more, more preferably 20 MPa or more, and further preferably 30 MP or more from the viewpoint of stable making of the critical state and induction of the reaction. The pressure in the reaction chamber is specified to be preferably 50 MPa or less, and more preferably 40 MPa or less from the viewpoints of controllability of pressure, pressure resistance of the reaction chamber, and the like. These temperature condition and pressure condition are preferable from the viewpoint of solubility of monomer as well.

The amount of diamine monomer and the amount of tetracarboxylic acid dianhydride monomer (amount of charge) may be determined in consideration of the types of monomers, the temperature condition, the pressure condition, the film thickness required, characteristics of the film required, and the like, although larger amounts are preferable from the viewpoint of film formation rate. The amount is preferably more than or equal to 15 times the amount of monomer in the case of a common vapor deposition polymerization method. Specifically, the amount of each of the diamine monomer and the tetracarboxylic acid dianhydride monomer in the reaction chamber is preferably $1.0 \times 10^{-7}$ mol or more, more preferably $1.0 \times 10^{-6}$ mol or more, and further preferably $1.0 \times 10^{-5}$ mol or more per cubic centimeter of volume of carbon dioxide in a supercritical state at the start of the reaction.

The amount of monomer is calculated on the basis of a total amount of carbon dioxide and monomers supplied to the reaction chamber. The amount of volume of carbon dioxide in the supercritical state is calculated on the basis of a total mass of carbon dioxide supplied and the temperature and the pressure in the reaction chamber.

The stoichiometric ratio of monomer units derived from diamine to monomer units derived from tetracarboxylic acid dianhydride is preferably 1:1 in the polyimide film. Therefore, it is preferable that the diamine monomer supplied to the reaction chamber be equalized to the tetracarboxylic acid dianhydride monomer on a mole basis. However, in consideration of ease in deactivation and the like of the monomer, the amount of diamine monomer or the amount of tetracarboxylic acid dianhydride monomer may be made larger than the amount of the other. Consequently, the molar ratio of the diamine monomer to the tetracarboxylic acid dianhydride monomer may be changed within the range of about 1.0:0.8 to 1.0:1.2. Specifically, in the case where the diamine monomer is 4,4'-diaminodiphenyl ether and the tetracarboxylic acid dianhydride monomer is pyromellitic acid anhydride, preferably, the molar ratio of the diamine monomer to the tetracarboxylic acid dianhydride monomer is specified to be 1:1.1.

The temperature of the substrate is specified to be a temperature higher than or equal to a temperature at which imidization occurs, as described above. Specifically, the temperature of the substrate is specified to be 150° C. or higher. The temperature is specified to be preferably 200° C. or higher, more preferably 220° C. or higher, and further preferably 250° C. or higher. From the viewpoint of suppressing thermal decomposition of polyimide, the temperature is specified to be preferably 500° C. or lower, more preferably 400° C. or lower, and further preferably 350° C. or lower.

A polyimide film is formed from the monomers supplied by specifying the temperature of the substrate to be higher than or equal to the temperature at which imidization occurs. Imidization occurs by two reactions, that is, generation of polyamic acid due to mutual polymerization of monomers and generation of polyimide due to dehydration and ring closure of polyamic acid. It is believed that polyamic acid is formed by mutual polymerization of the diamine monomer and the tetracarboxylic acid dianhydride monomer supplied to the surface of the substrate, and the resulting polyamic acid is imidized promptly on the surface of the substrate, so as to be converted to polyimide.

Polyamic acid may remain to some extent at the point in time when the film formation is finished. In this case, additional imidization (post baking) may be performed by heating the substrate while the inside of the reaction chamber has been substituted with carbon dioxide which is in a supercritical state and which contains no monomer. At this time, a co-solvent can be removed from the polyimide film unless the co-solvent is added to the carbon dioxide in a supercritical state. Alternatively, additional imidization may be performed by heating the substrate in the environment of normal pressure, pressurization, or reduced pressure after the substrate is taken out of the reaction chamber. The additional imidization may be performed at a heat treatment temperature at which imidization occurs.

In addition, a catalyst may be used in the additional imidization. A known catalyst, e.g., an amine based compound, may be used as the catalyst. A dehydrating agent may be used in order to further facilitate removal of water generated by imidization. A known dehydrating agent, e.g., carboxylic acid anhydride, may be used as the dehydrating agent.

In the present embodiment, preferably, heat insulation is performed sufficiently in such a way that the temperature of the atmosphere in the reaction chamber is not raised because of heating of the surface of the substrate. An occurrence of imidization can be suppressed in a portion other than the surface of the substrate by performing heat insulation sufficiently.

The film formation time may be specified on the basis of the film thickness and the like of the polyimide film required. For example, in the case where the monomer concentration is about $1\times10^{-6}$ mol/cm$^3$ to $1\times10^{-5}$ mol/cm$^3$, a polyimide film having a thickness of about 30 μm to 50 μm can be formed in about 1.5 hours.

Film Forming Apparatus

Figure 1:
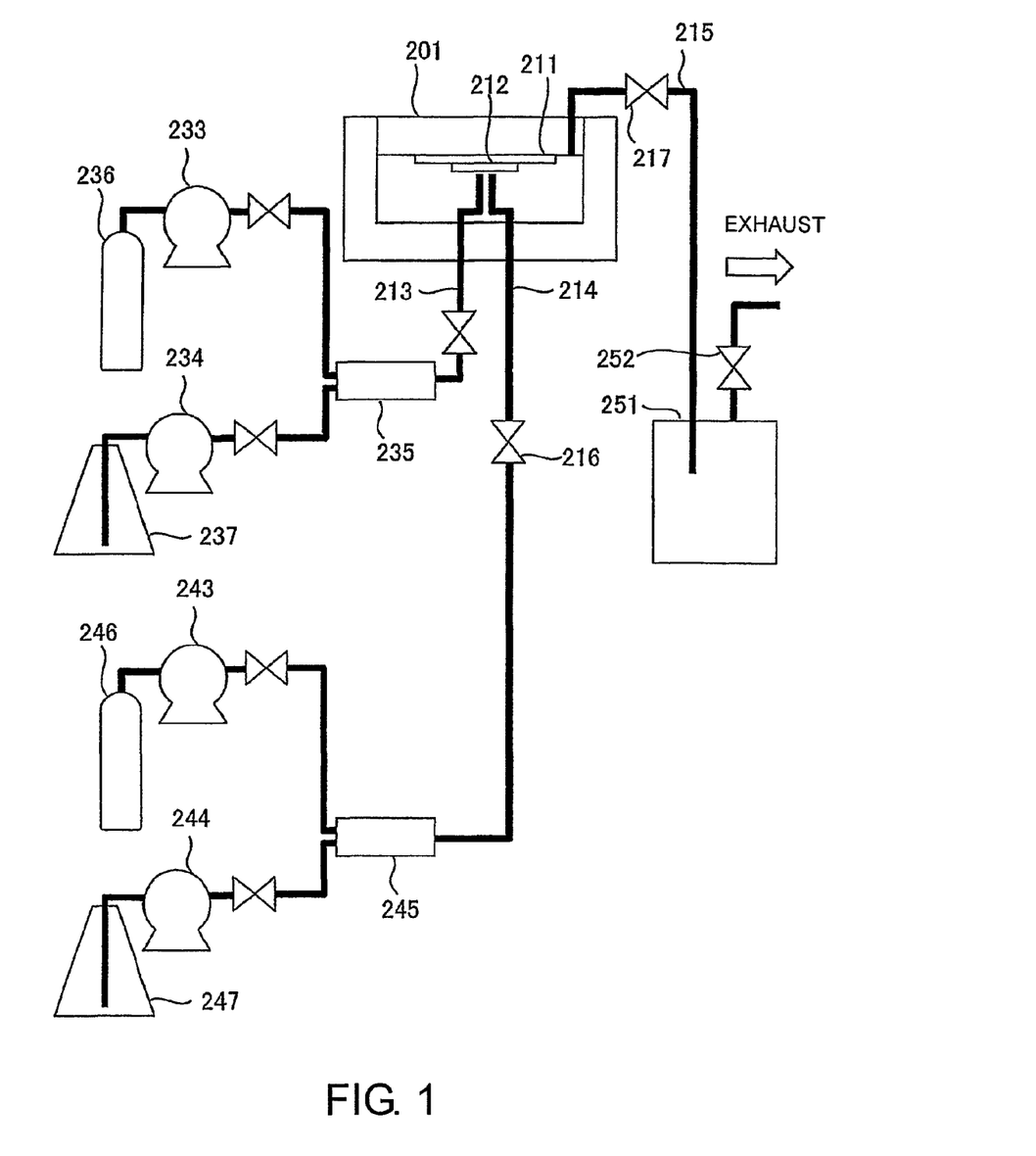
FIG. 1 is a schematic diagram showing an example of a film-forming device according to the present embodiment.

An apparatus described below may be used for forming the polyimide film. FIG. 1 shows an example of a film-forming apparatus of a polyimide film. A substrate holder 211 is disposed in a reaction chamber 201, and a substrate 212 is attached to the substrate holder 211 with a film-forming surface, on which the polyimide film is to be formed and which is directed downwards of FIG. 1 in this example. In the reaction chamber 201, a first supply line 213, a second supply line 214, and a discharge line 215 are disposed. Each line has a plurality of valves 216 for control. As for both the first supply line and the second supply line, supply lines are extended from an outlet of a pump 233 or 243 (for feeding carbon dioxide) and from an outlet of a pump 234 or 244 (for feeding a monomer dissolved in DMF) to an inlet of the reaction chamber 201. The supply lines are maintained at the same temperature as the temperature of the atmosphere of the reaction chamber 201 by a constant temperature bath or a heater. A valve disposed in the discharge line 215 is a back pressure regulator 217. Consequently, the pressure in the reaction chamber 201 is maintained at a constant value.

The first supply line 213 supplies a diamine monomer. The first supply line 213 is connected to the pump 233 to feed carbon dioxide, the pump 234 to feed the diamine monomer dissolved in DMF, and a line mixer 235 to mix carbon dioxide and the diamine monomer. The pump 233 is connected to a bomb 236 of carbon dioxide. The pump 234 is connected to a container 237 holding a solution in which the diamine monomer is dissolved in a co-solvent. The supply line from the outlets of the pumps 233 and 234 to the inlet of the reaction chamber 201 is maintained at the same temperature as the temperature of the atmosphere of the reaction chamber 201 by a constant temperature bath or a heater.

The second supply line 214 supplies a tetracarboxylic acid dianhydride monomer. The second supply line 214 is connected to the pump 243 to feed carbon dioxide, the pump 244 to feed the tetracarboxylic acid dianhydride monomer dissolved in DMF, and a line mixer 245 to mix carbon dioxide and the tetracarboxylic acid dianhydride monomer. The pump 243 is connected to a bomb 246 of carbon dioxide. The pump 244 is connected to a container 247 holding a solution in which the tetracarboxylic acid dianhydride monomer is dissolved in a co-solvent. The supply line from the outlets of the pumps 243 and 244 to the inlet of the reaction chamber 201 is maintained at the same temperature as the temperature of the atmosphere of the reaction chamber 201 by a constant temperature bath or a heater.

The amounts of supply of the diamine monomer and the tetracarboxylic acid dianhydride monomer can be monitored by measuring the masses of the container 237 and the container 247 with an electrobalance. In the case where a co-solvent is not used, the diamine monomer and the tetracarboxylic acid dianhydride monomer may be filled into the mixer.

In FIG. 1, a polyamic acid removal portion 251 is disposed immediately following the back pressure regulator 217 of the discharge line 215. The polyamic acid removal portion 251 is a recovery container having a pressure relief valve 252, and the pressure in the container is reduced to a pressure lower than or equal to the critical point of carbon dioxide. In this manner, carbon dioxide in a supercritical state is converted to a gas and, therefore, unreacted monomers and polyamic acid can be recovered in the container. Consequently, it is possible to suppress an occurrence of plugging in the discharge line 215 due to precipitation of polyamic acid in the discharge line 215.

Figure 2:
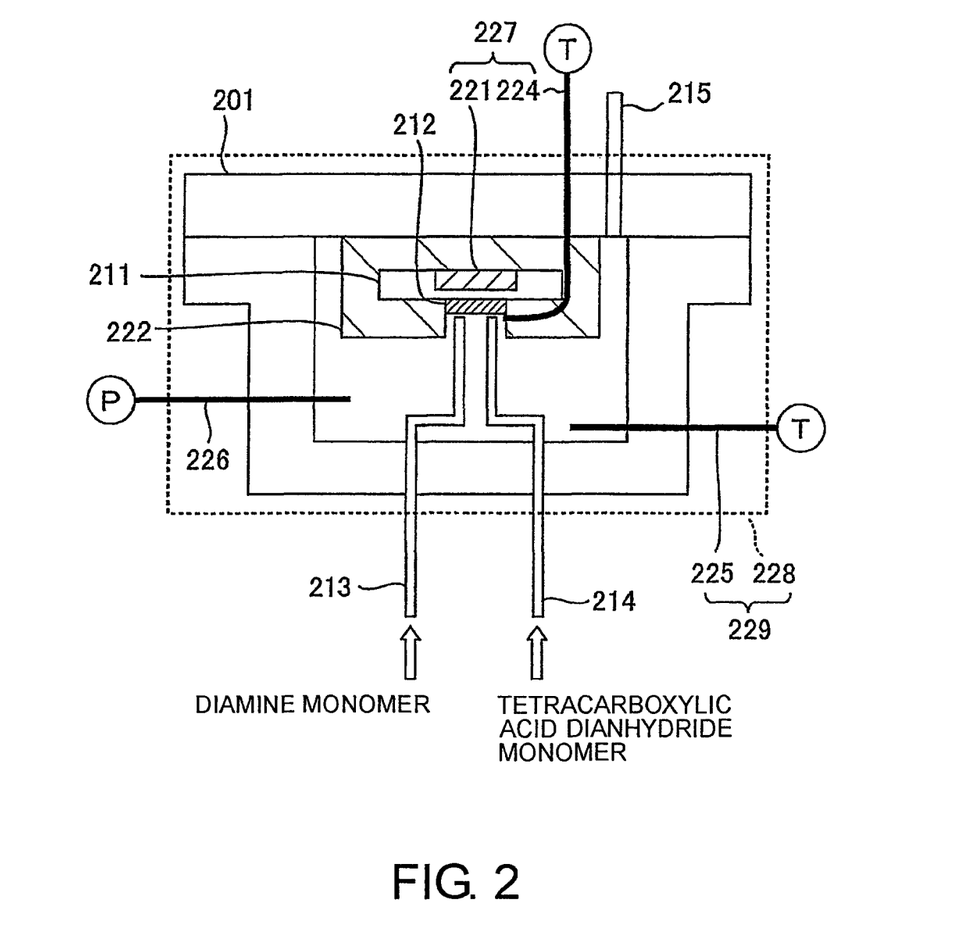
FIG. 2 is a detailed diagram of a reaction chamber according to the present embodiment.

FIG. 2 is a detailed diagram of the reaction chamber 201. The substrate holder 211 has a substrate temperature control portion 227 including a temperature sensor 224 to measure the temperature of the substrate 212 and a heater 221, so that the temperature of the substrate 212, can be set optionally. Disposed is a heat insulating portion 222 that covers the substrate holder 211 in such a way as to expose only the surface of the substrate 212, so that an increase in temperature of the atmosphere due to the heater 221 can be suppressed. Any material may be employed for the heat insulating portion 222 insofar as the material has the heat resistance and the heat insulating property. For example, polyimide can be employed for formation. The temperature of the atmosphere of the reaction chamber 201 can be controlled at a constant temperature by an atmosphere temperature control portion 229 which includes a constant temperature bath 228 holding the reaction chamber 201 and a temperature sensor 225 disposed in the reaction chamber 201. The pressure in the reaction chamber 201 is maintained at a constant value by the back pressure regulator 217 (FIG. 1) of the discharge line 215. The pressure in the reaction chamber 201 can be measured by a pressure sensor 226. Alternatively, the reaction chamber 201 is not held in the constant temperature bath, but a heater may be disposed in the reaction chamber 201, so as to control the temperature in the reaction chamber 201. The reaction chamber 201 may be held in a constant temperature bath to control the temperature of the first supply line and the second supply line.

In the film formation, the reaction chamber 201 may be kept at a temperature that is higher than or equal to the critical point of carbon dioxide and that is lower than a temperature at which imidization occurs by the atmosphere temperature control portion 229. The substrate 212 may be set at a temperature higher than or equal to the temperature at which imidization occurs by the substrate temperature control portion 227. The reaction chamber 201 may be kept at a pressure more than or equal to the critical point of carbon dioxide.

Initiators and the like are not required for the reaction to generate polyamic acid from the diamine monomer and the tetracarboxylic acid dianhydride monomer, and the reaction is started promptly by mixing the two monomers. The resulting polyamic acid is a low molecular weight polyamic acid at an initial stage of polymerization and, thereafter, grows as the polymerization reaction of the raw material monomers proceeds, so that the molecular weight increases. This relatively low molecular weight polyamic acid is dissolved into supercritical carbon dioxide, and the solubility thereof is especially large as compared with that in the vapor deposition polymerization method, as described above. Meanwhile, supercritical carbon dioxide is a poor solvent with respect to the polyamic acid having a high molecular weight. Consequently, when the reaction proceeds between the diamine monomer and the tetracarboxylic acid dianhydride monomer, polyamic acid having a high molecular weight is formed. This brings about precipitates that are not dissolved into supercritical carbon dioxide and that make it difficult to supply to film-forming surfaces, for example, insides of fine concave portions and inside walls of small gaps. Therefore, preferably, the diamine monomer and the tetracarboxylic acid dianhydride monomer are mixed in close proximity to the film-forming surface. For example, preferably, the supply lines are disposed independently of each other, and the diamine monomer and the tetracarboxylic acid dianhydride monomer are introduced and mixed in the vicinity of the film-forming surface in the reaction chamber. Specifically, 1 mm or less is preferable as the space between the outlets of the first supply line 213 and the second supply line 214 and the film-forming surface, and the upper limit is preferably 10 mm or less.

On the other hand, the substrate is heated to the temperature at which imidization occurs and, therefore, it is preferable that the outlets of the first supply line 213 and the second supply line 214 be apart from the film-forming surface to some extent from the viewpoint of avoidance of generation of unnecessary polyimide at the outlets of the first supply line 213 and the second supply line 214. Therefore, 500 µm or more is preferable as the space between the outlets of the first supply line 213 and the second supply line 214 and the film-forming surface. However, as for the space between the outlets of the first supply line 213 and the second supply line 214 and the film-forming surface, the allowances of the upper limit and the lower limit can be increased by increasing the flow rate of supercritical carbon dioxide.

Preferably, the substrate is disposed with the film-forming surface directed downwards and, in addition, the diamine monomer and the tetracarboxylic acid dianhydride monomer are preferably supplied from below in a direction perpendicular to the film-forming surface kept at a relatively high-temperature which is a controlled temperature higher than or equal to the imidization temperature. For example, it becomes possible to avoid disturbance resulting from convection of supercritical carbon dioxide by arranging the outlet of the first supply line 213 and the outlet of the second supply line 214 in such a way as to become opposite to the film-forming surface in the perpendicular direction without disposing a straightening vane or plate. Then, the raw material monomers and polyamic acid generated therefrom can be supplied to the film-forming surface efficiently and uniformly. Consequently, the film quality of the polyimide film can be improved, and the surface smoothness of the film can also be improved. At this time, the film quality of the polyimide film can be improved by equalizing the distance between the outlet of the first supply line 213 and the film-forming surface to the distance between the outlet of the second supply line 214 and the film-forming surface. In addition, in the case where the outlet of the first supply line 213 and the outlet of the second supply line 214 are disposed adjacently, the polymerization reaction is controlled easily with good reproducibility, where the polymerization occurs until supercritical carbon dioxide introduced into the reaction chamber reaches the film-forming surface. Consequently, the film quality of the polyimide film can be improved.

Part of the diamine monomer supplied from the first supply line 213 and the tetracarboxylic acid dianhydride monomer supplied from the second supply line 214 serve as monomers dissolved in carbon dioxide in a supercritical state and reach the film-forming surface. Parts of the remainder reacted reach to the film-forming surface in the state of polyamic acid dissolved in supercritical carbon dioxide. In FIG. 2, the substrate 212 is disposed with the film-forming surface down, and the first supply line 213 and the second supply line 214 are disposed below the substrate 212. The film quality of the polyimide film can be improved by employing such an arrangement because if precipitated and particulate high-molecular weight polyamic acid is generated resulting from abnormal growth, the high-molecular weight polyamic acid sinks downward and does not reach the film-forming surface of the substrate 212 easily, so that no contribution is made to film formation.

Preferably, the flow rate of carbon dioxide in a supercritical state is increased in order that the diamine monomer supplied from the first supply line 213 and the tetracarboxylic acid dianhydride monomer supplied from the second supply line 214 are allowed to reach the film-forming surface of the substrate 212 as much as possible while being dissolved in carbon dioxide in a supercritical state. It is preferable that a flow is caused to flow in a constant direction from the outlet of the first supply line 213 and the outlet of the second supply line 214 toward the film-forming surface. Consequently, the location of the discharge line 215 is also important in addition to the locations of the first supply line 213 and the second supply line 214. Preferably, the discharge line 215 is disposed at a location higher than the substrate 212 in the reaction chamber 201.

Figure 3:
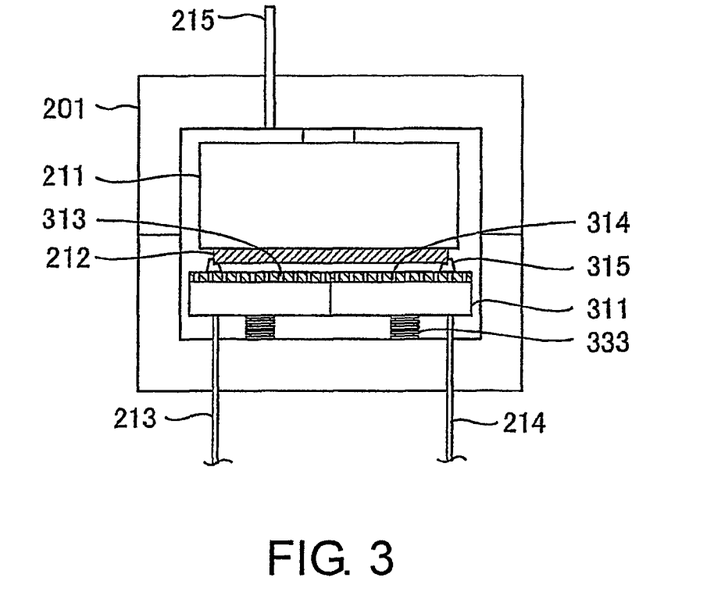
FIG. 3 is a detailed diagram of a modified example of a reaction chamber according to the present embodiment.
Figure 4:
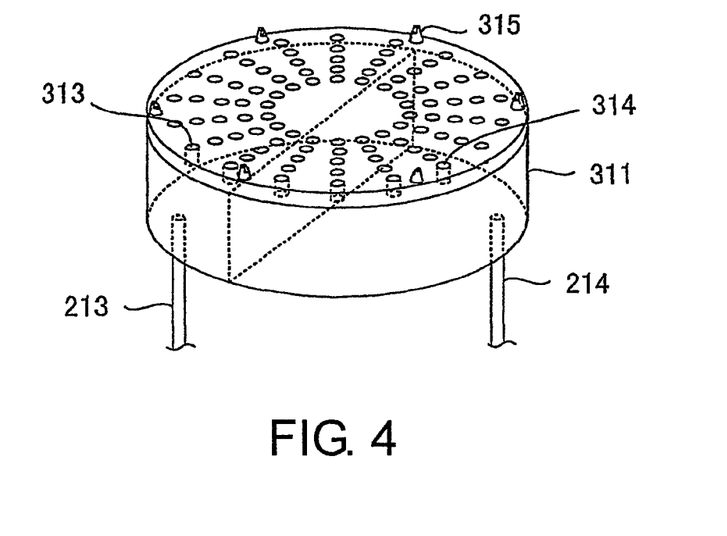
FIG. 4 is an enlarged bird's eye view showing a shower head.

Next, a modified example of the method for forming the polyimide film according to the present embodiment will be described with reference to the drawings. FIG. 3 is a detailed diagram of a reaction chamber 201, and FIG. 4 is a bird's eye view of a shower head 311 shown in FIG. 3. As shown in FIGS. 3 and 4, the upper surface of the shower head 311 is flat and has a plurality of first outlets or nozzles 313 to discharge the diamine monomer and a plurality of second outlets or nozzles 314 to discharge the tetracarboxylic acid dianhydride monomer. The shower head 311 has a cavity which surrounds a hollow space therein and which is divided into two regions (namely, first and second partial cavities) by a partition. The first supply line 213 is connected to one region and the diamine monomer is supplied. The diamine monomer is introduced into the reaction chamber from the plurality of first outlets or nozzles 313. Likewise, the second supply line 214 is connected to the other region of the inside of the shower head 311, and the tetracarboxylic acid dianhydride monomer is supplied. The tetracarboxylic acid dianhydride monomer is introduced into the reaction chamber from the plurality of second outlets or nozzles 314.

Meanwhile, a plurality of protruding portions 315 are disposed in the peripheral portion of the upper surface of the shower head 311. The protruding portion 315 is disposed as an installation support of the substrate and has a tall portion outside the edge portion of the substrate to prevent the substrate from falling. Also, the substrate 212 is placed on the protruding portions 315 with the film-forming surface directed downwards and, thereby, the distance or gap between the film-forming surface and the outlets (or nozzles) 313 and 314 can be set at a predetermined value, so that the protruding portions 315 also serves as spacers. In this embodiment, the shower head 311 also functions as a straightening vane or plate and, therefore, a reduction in monomer concentration due to sinking of the monomer supplied can be suppressed. Preferably, a smaller space or gap is left between the shower head 311 and the substrate 212. Specifically, 10 mm or less is preferable, and 1 mm or less is more preferable.

Pressing members 333, e.g., springs, are disposed between the lower surface of the shower head 311 and the reaction chamber 201, so that the back of the film-forming surface of the substrate 212 can be pressed against the substrate holder 211 including a heater portion with a predetermined pressure. Consequently, working objects having various thicknesses, e.g., stacked substrates, can be placed in the same manner. In addition, supercritical carbon dioxide is prevented from entering between the back of the substrate 212 and the substrate holder 211 by selecting the material for the surface of the substrate holder 211 appropriately. For example, when a polyimide film has been formed between the back of the substrate 212 and the substrate holder 211, the polyimide film serves as a heat insulating material and temperature control of the substrate may become difficult. That is, the substrate holder 211 including the heater portion can control the temperature of the film-forming surface of the substrate 212 reliably by employing the above-described configuration. Furthermore, the discharge line 215 is disposed in the upper portion of the reaction chamber 201.

The discharge line 215 of the reaction chamber 201 is disposed at a location higher than the substrate 212, so that the flow of carbon dioxide in a supercritical state is guided from the shower head 311 through the substrate 212 toward the discharge line 215 easily and the raw material monomers are supplied to the surface of the substrate 212 more smoothly.

According to this embodiment, in the case where, for example, the substrate 212 is a silicon wafer having a diameter of 300 mm as well, the raw material monomers dissolved in carbon dioxide in a supercritical state can be supplied to all over the film-forming surface of the substrate 212 uniformly from below in a direction perpendicular to the film-forming surface of the substrate 212 and from the outlets (nozzles) 313 and 314 close to the film-forming surface. The diamine monomer and the tetracarboxylic acid dianhydride monomer are completely separated up to the outlets (nozzles) 313 and 314 and are discharged from the outlets (nozzles) 313 and 314 in a direction perpendicular to the substrate 212 film-forming surface. Therefore, the raw material monomers reach the film-forming surface in a short time after mixing, so that the diamine monomer and the tetracarboxylic acid dianhydride monomer are allowed to reach the substrate 212 film-forming surface easily while being dissolved in supercritical carbon dioxide. The raw material monomers reach the film-forming surface of the substrate 212 and are adsorbed by the film-forming surface, so as to generate polyamic acid by the polymerization reaction on the film-forming surface. The film-forming surface is controlled at a temperature higher than or equal to the imidization temperature and, therefore, polyamic acid is imidized promptly. Parts of the raw material monomers undergo the polymerization reaction in a very narrow gap between the shower head 311 and the film-forming surface of the substrate 212 to generate polyamic acid, and most of the resulting polyamic acid can reach the film-forming surface of the substrate 212 while being dissolved in low-molecular weight supercritical carbon dioxide. This polyamic acid is also adsorbed by the film-forming surface like in the monomers and polyimide is generated. Even if high-molecular weight polyamic acid is generated abnormally, precipitation is caused to occur. As a result, adsorption to the film-forming surface does not occur and such polyamic acid is removed. FIGS. 3 and 4 show the configuration in which the inside of the shower head 311 is divided into the two regions, namely, the first and the second partial cavities, and the first outlets (nozzles) 313 and the second outlets (nozzles) 314 are separated into left and right regions of the shower head. In this case as well, the raw material monomers are discharged into a very narrow gap between the shower head 311 and the film-forming surface of the substrate 212 and, therefore, are mixed promptly.

As for another modified example of the embodiment, it is preferable that each of the first outlets (nozzles) 313 and the second outlets (nozzles) 314 be disposed in such a way as to be distributed uniformly in the upper surface of the shower head 311. The inside of the shower head 311 may be divided into still finer regions and a plurality of fan-shaped regions may be formed. In this case, regions including the first outlets 313 and the regions including the second outlets 314 may be disposed alternately. The inside of the shower head 311 may be divided in such a way that two spiral paths are formed.

In the case where the above-described configurations are employed, the first outlets (nozzles) 313 and the second outlets (nozzles) 314 are close to or adjacent to each other, so that the monomers discharged from the individual outlets (nozzles) start the polymerization reaction immediately, and polyamic acid is generated. The flow of supercritical carbon dioxide is set in a direction perpendicular to the film-forming surface and, therefore, polyamic acid reaches the film-forming surface after a predetermined time has elapsed while being dissolved in supercritical carbon dioxide. That is, the first outlets 313 and the second outlets 314 are close to each other, and the distance between the film-forming surface and the first outlet 313 is nearly equal to the distance between the film-forming surface and the second outlet 314. Therefore, the resulting polyamic acid has nearly uniform molecular weight, so that a uniform polyimide film having good surface smoothness is obtained.

Figure 5:
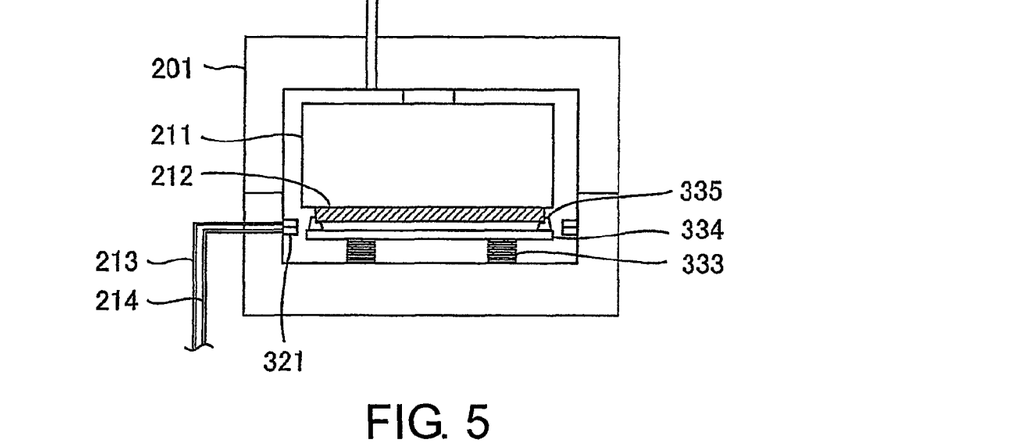
FIG. 5 is a detailed diagram of a modified example of a reaction chamber according to the present embodiment.
Figure 6:
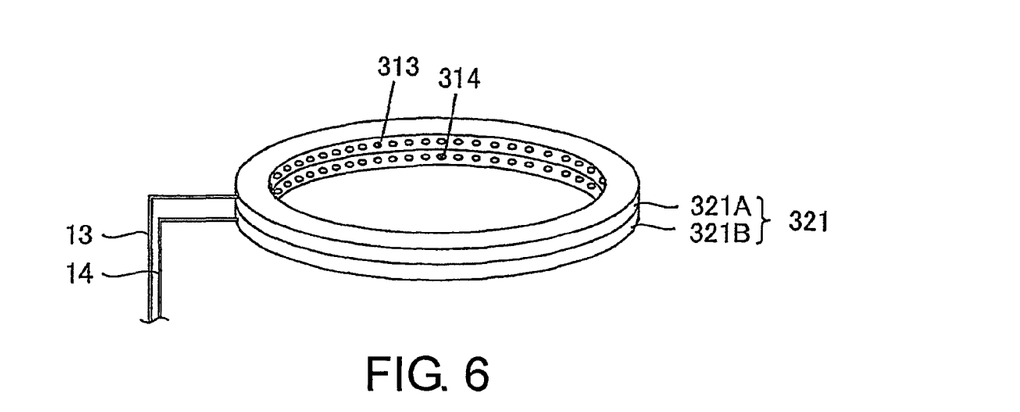
FIG. 6 is an enlarged bird's eye view showing a shower head.
Figure 7:
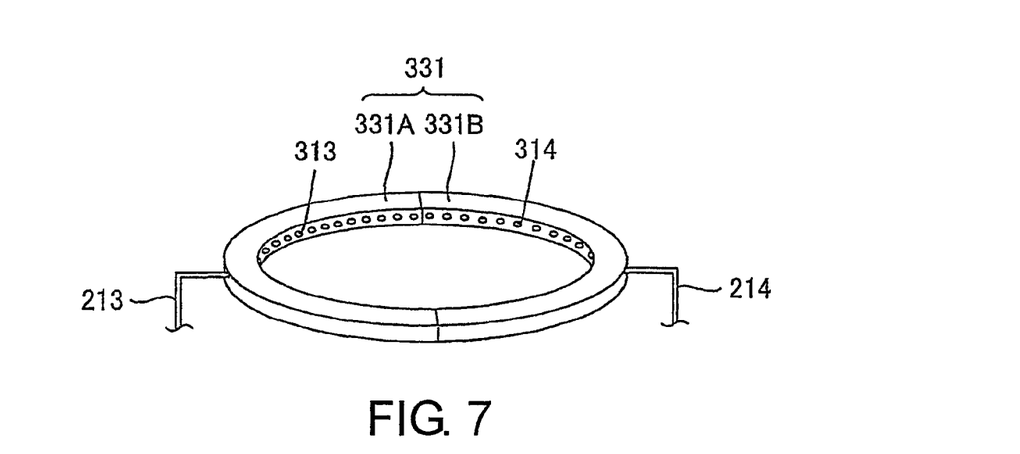
FIG. 7 is an enlarged bird's eye view showing a shower head.

Next, another modified example of the method for forming the polyimide film according to the present embodiment will be described with reference to the drawings. FIG. 5 is a detailed diagram of a reaction chamber 201, and FIGS. 6 and 7 are bird's eye views of a shower head 321. In the embodiment shown in FIG. 3, an example is shown in which the raw material monomers are supplied from below the substrate 212. However, as shown in FIGS. 5 and 6, the raw material monomers may be supplied from the side of the substrate 212. A straightening vane 334 is disposed opposite to the substrate 212 and parallel to the film-forming surface. Pressing members 333 are disposed between the lower surface of the straightening vane or plate 334 and the reaction chamber 201, so that the straightening vane 334 is pressed against the substrate 212. Protruding portions 335 are disposed on the upper surface of the straightening vane 334 and a constant space or gap is kept between the straightening vane 334 and the substrate 212.

A ring-shaped shower head 321 is disposed in such a way to surround the substrate 212 and the straightening vane 334. As shown in FIG. 6, an inside circumference of the shower head 321 has first outlets (nozzles) 313 to discharge the diamine monomer and second outlets (nozzles) 314 to discharge the tetracarboxylic acid dianhydride monomer. The diamine monomer supplied from the first outlets (nozzles) 313 and the tetracarboxylic acid dianhydride monomer supplied from the second outlets (nozzles) 314 flow into the gap between the substrate 212 and the straightening vane 334. The straightening vane 334 is disposed and, thereby, settlement of the monomers does not occur easily, so that the amount of monomers can be increased and the film can be formed efficiently, where the monomers are supplied to the surface of the substrate while being dissolved in carbon dioxide in a supercritical state. Preferably, a smaller space or gap is left between the straightening vane 334 and the substrate 212. Specifically, 1 mm or less is preferable, and 500 μm or less is more preferable.

FIG. 6 shows an example in which a first ring 321A having first outlets (nozzles) 313 and a second ring 321B having second outlets (nozzles) 314 are stacked as a shower head 321. However, as shown in FIG. 7, a shower head 331 may be formed from a semicircular first portion 331A having first outlets (nozzles) 313 and a semicircular second portion 331B having second outlets (nozzles) 314 and be used. In addition, the configuration may employ alternate disposition of portions having the first outlets (nozzles) 313 and portions having the second outlets (nozzles) 314.

In the case of this embodiment, the monomers are introduced into the small gap between the straightening vane 334 and the substrate 212 and it is preferable to minimize the residence time of the monomers in this gap by increasing the flow rate of supercritical carbon dioxide. Consequently, generation of high-molecular weight polyamic acid is suppressed, the raw material monomers and polyamic acid are supplied to the film-forming surface of the substrate 212 while being dissolved in supercritical carbon dioxide, imidization is performed and, thereby, a polyimide film can be obtained. In this case as well, even if high-molecular weight polyamic acid is generated and is precipitated, adsorption to the film-forming surface does not occur and discharge is performed because the film-forming surface is arranged in a downward direction.

In the above description, the example has been shown in which the polyimide film is formed on the surface of the substrate. However, a polyimide film may be filled in a gap between substrates of a stacked substrate.

Figure 8A:
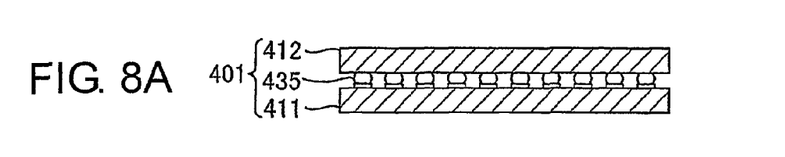
FIGS. 8A to 8D are sectional views showing a method for manufacturing a semiconductor device, according to the present embodiment, in the order of steps.

As shown in FIG. 8A, a stacked substrate 401 is formed by stacking a first substrate 411 and a second substrate 412 with bumps 435 interposed therebetween.

Figure 8B:
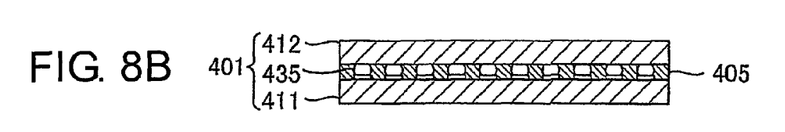

As shown in FIG. 8B, a polyimide film 405 is filled in the gap between the first substrate 411 and the second substrate 412.

Figure 8C:
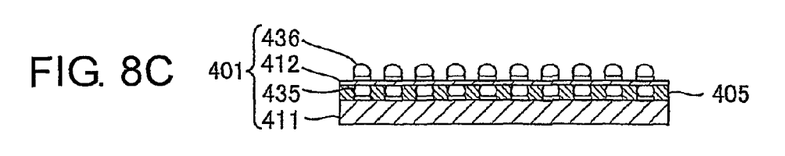

As shown in FIG. 8C, the second substrate 412 is ground to reduce the thickness. Subsequently, bumps 436 are formed on the ground surface of the second substrate 412.

Figure 8D:
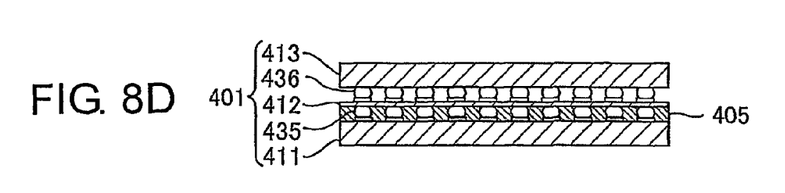

As shown in FIG. 8D, a third substrate 413 is stacked by using bumps 436. Thereafter, a stacked substrate 401 having a predetermined number of stacking is formed by repeating filling of a polyimide film, grinding of the third substrate, formation of an electrode, and stacking of a substrate appropriately. Finally, a stacked semiconductor chip is formed by, for example, dicing into the individual chips.

The height of the bump 435 falls within a range between several micrometers and several tens of micrometers. Usually, it is difficult to allow a solvent containing dissolved polyamic acid to enter the gap between the substrates by conventional method for forming a polyimide film by using an organic solvent. In the case where the solvent is allowed to enter by application of a pressure, the substrate may be damaged. Even when the solvent containing dissolved polyamic acid is allowed to enter, the film thickness is reduced significantly while the solvent is vaporized and voids are formed. Therefore, it is difficult to maintain the mechanical strength of bonding between the substrates in such a way as to endure grinding.

Meanwhile, in the case of the vapor deposition polymerization method as well, precipitated polyamic acid is accumulated and, thereby, it is difficult to form a polyimide film in such a way as to fill a gap of several micrometers to several tens of micrometers.

Figure 9:
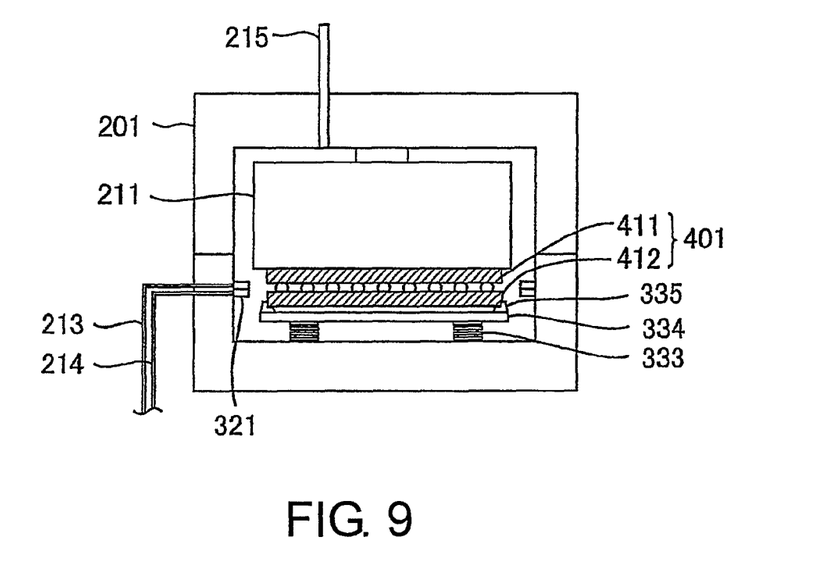
FIG. 9 is a schematic diagram showing an example of a step to form a polyimide film between stacked substrates.

In the case where carbon dioxide in a supercritical state is used as the solvent, as shown in FIG. 9, a polyimide film can be formed easily in such a way as to fill a gap of several micrometers to several tens of micrometers between the substrates by supplying the raw material monomers in the state of being dissolved in supercritical carbon dioxide from the side of the stacked substrate.

The example has been explained, wherein the polyimide film is filled between the substrates by supplying the monomers from the side of the substrate. However, in the case where the monomers are supplied from below the substrate shown in FIGS. 8A to 8D as well, a polyimide film can be filled in between the substrates.

Figure 10:
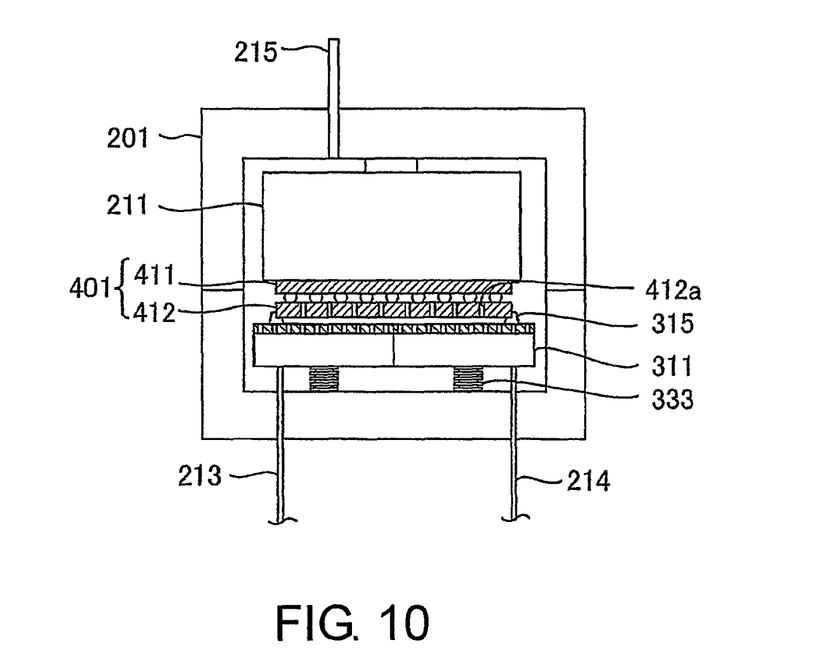
FIG. 10 is a schematic diagram showing an example of a step to form a polyimide film between stacked substrates.

In the case where the monomers are supplied from below the substrate, as shown in FIG. 10, a plurality of through holes 412a may be formed in the second substrate 412 in advance. The raw material monomers dissolved in carbon dioxide in a supercritical state pass through the through holes 412a of the second substrate 412 and enter a gap between the first substrate 411 and the second substrate 412. Consequently, a polyimide film is filled in between the first substrate 411 and the second substrate 412. In addition, in the case where the substrate are stacked, substrates having through holes may be stacked.

Figure 11:
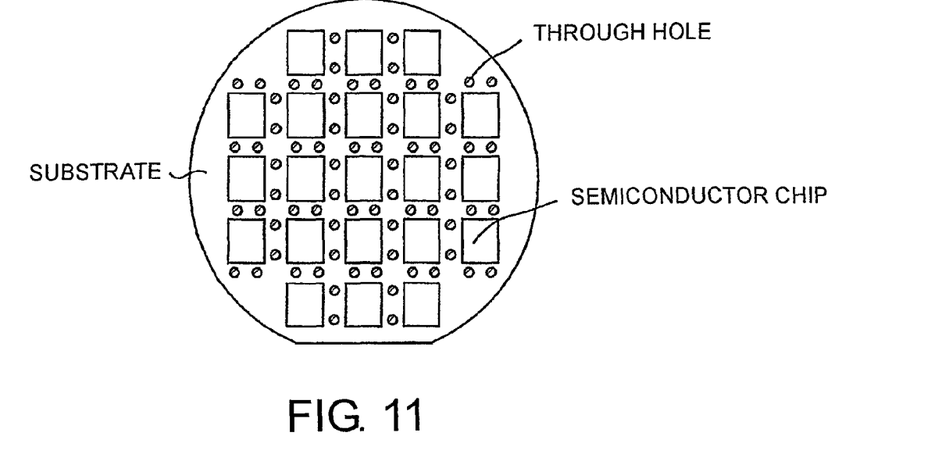
FIG. 11 is a plan view showing an example of formation of through holes.

The through holes 412a may be disposed in any portion of the substrate. However, as shown in FIG. 11, it is preferable that the through holes be disposed along the dicing line used in division into chips.

Figure 12:
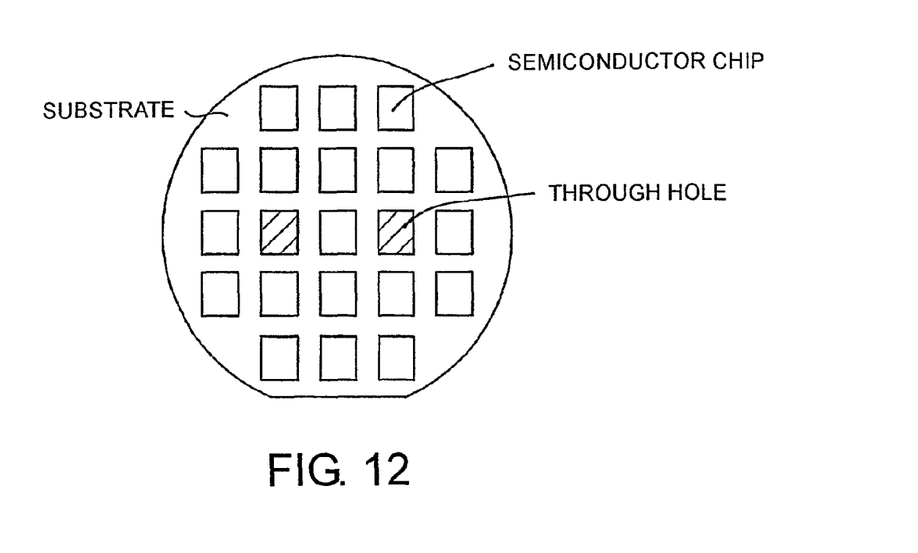
FIG. 12 is a plan view showing an example of formation of through holes.

Alternatively, as shown in FIG. 12, among a plurality of chips formed on the substrate, for example, two chips are not formed, and through holes may be formed.

The method for forming a polyimide film and the film-forming device according to the present invention can form a polyimide film efficiently in accordance with a surface having a complicated shape and, therefore, are useful in fields in need of polyimide films.

Although the above-mentioned description has been made only about the polyimide film formation, the present invention is applicable to any other film formation. Especially, the apparatuses or methods illustrated in FIGS. 5, 6, 7, 9, and 10 can be used to form various films. In this event, the methods performed in the apparatuses shown in FIGS. 5, 6, 7, and 9 may be specified by disposing a substrate within a reaction chamber 201 and forming a film on a surface of the substrate 212 disposed within the reaction chamber 201. The forming step of the film is featured by arranging an element, such as the protruding portions 335 (FIG. 5), on a surface of the substrate 212 disposed within the reaction chamber 201. In the example illustrated in FIGS. 5 and 6, a gap is formed between the substrate 212 and the straightening vane or plate 334 and may be formed by the use of bumps 435 illustrated in FIG. 8. Under the circumstances, first and second materials are supplied through first and second supply lines or paths 213 and 214 which are separated from each other. Thereafter, the first and the second materials are sent through first and second plural discharge outlets, such as 313, 314 of FIG. 6, that are coupled to the first and the second supply paths 213 and 214, respectively. The first and the second plural discharge outlets are faced towards a side surface of the gap and are close to one another. Thus, the first and the second materials are independently discharged within the gap through the first and the second plural discharge outlets 313, 314 and are mixed together within the gap to form the film on the surface of the substrate 201. The element may be a plate and a like including a substrate.

In the modified example shown in FIG. 6, the first and the second plural discharge outlets 313 and 314 include a plural sets of first and second discharge nozzles close to one another, as illustrated in FIG. 6. This structure is similar to the apparatus shown in FIG. 7. Specifically, the plural sets of the first and the second discharge nozzles are uniformly disposed around the side surface surrounding the gap. At any rate, the first and the second plural discharge outlets 313 and 314 are disposed on a side portion of a cavity formed within the reaction chamber 201. The side portion of the cavity is faced to the gap and surrounds the side surface of the gap, as shown in FIGS. 5 to 7. In this event, the first and the second plural discharge outlets 313 and 314 may be divided in a manner illustrated in FIG. 3 by a partition which serves to divide the cavity into first and second partial cavities of the cavity. In this case, the first and the second materials are introduced through first and second supply paths to the first and the second partial cavities, respectively.

With this structure, it is possible to uniformly and quickly supply a reacted material to a narrow gap over an entire surface of a large scale semiconductor substrate before the reacted material which results from a reaction of the first and the second materials is polymerized and precipitated. At any rate, the methods mentioned in conjunction with FIGS. 5, 6, 7, and 9 are applicable to general materials used for a semiconductor device without being restricted to the materials dissolved within the carbon dioxide in the supercritical state.

In addition, the method mentioned in FIG. 10 is also applicable to the general materials like in FIGS. 5, 6, 7, and 9. In this event, the method of FIG. 10 is featured by preparing a stacked substrate body 401 which stacks first and second substrates 411 and 412 through bumps 436 (FIG. 8(C)) to provide a gap between the first and the second substrates 411 and 412 and filling a material within the gap between the first and the second substrates. Specifically, at least one of the first and the second substrates 411 and 412 has through holes. In FIG. 10, the through holes 412a are formed in the second substrate 412. The material is supplied through the through holes 412a to the gap.

This structure also makes it possible to uniformly and quickly supply the reacted material to a narrow gap over an entirety of a large scale semiconductor substrate before the reacted material which results from a reaction of the first and the second materials is polymerized and precipitated, like in FIGS. 5 to 7 and 9.

What is claimed is:

1. A method of manufacturing a semiconductor device, comprising:
    disposing a substrate within a reaction chamber; and
    forming a polyimide film on a surface of the substrate located with the reaction chamber;
    wherein the forming the polyimide film comprises:
    supplying both a diamine monomer dissolved within a carbon dioxide in a supercritical state and a tetracarboxylic acid dianhydride monomer dissolved within a carbon dioxide in a supercritical state through individual supply lines to a portion adjacent to the substrate;
    mixing both the above-mentioned diamine monomer and tetracarboxylic acid dianhydride monomer together in the vicinity of the substrate; and
    reacting, on the surface of the substrate, the diamine monomer and the tetracarboxylic acid dianhydride monomer reached to the surface of the substrate in the supercritical states, along with a polyamic acid resulting from a reaction of the diamine monomer with the tetracarboxylic acid dianhydride monomer, to form the polyimide film on the surface of the substrate.

2. The method of manufacturing a semiconductor device, according to claim 1, wherein:
    the forming the polyimide film comprises:
    keeping the surface of the substrate at a temperature not lower than a temperature at which imidization is caused to occur;
    keeping an atmosphere within the reaction chamber at a temperature that is not lower than a temperature at which the carbon dioxide is kept into the supercritical state and that is lower than a temperature at which the imidization is caused to occur; and
    keeping the reaction chamber into a pressure that is not lower than a pressure at which the carbon dioxide is kept in the supercritical state.

3. The method of manufacturing a semiconductor device, according to claim 2, wherein:
    the forming the polyimide film comprises:
    placing the surface of the substrate as a film-forming surface which is to form the polyimide film and which is directed downwards; and
    supplying, from a lower side of the substrate to the film-forming surface, both the diamine monomer dissolved within the carbon dioxide in the supercritical state and the tetracarboxylic acid dianhydride monomer dissolved within the carbon dioxide in the supercritical state.

4. The method of manufacturing a semiconductor device, according to claim 2, wherein:
    the forming the polyimide film comprises:
    placing the surface of the substrate as a film-forming surface which is to form the polyimide film and which is directed downwards;
    disposing a flow straightening plate which is parallel with the film-forming surface and which is opposed to the film-forming surface with a gap left between the flow straightening plate and the film-forming surface; and
    introducing, into the gap between the flow straightening plate and the film-forming surface, both the diamine monomer dissolved within the carbon dioxide in the supercritical state and the tetracarboxylic acid dianhydride monomer dissolved within the carbon dioxide in the supercritical state.

5. The method of manufacturing a semiconductor device, according to claim 4, wherein:
    the forming the polyimide film is carried out by:
    using a discharge outlet for discharging the diamine monomer dissolved within the carbon dioxide in the supercritical state and a discharge outlet for discharging the tetracarboxylic acid dianhydride monomer dissolved within the carbon dioxide in the supercritical state, both the discharge outlets being disposed close to each other.

6. The method of manufacturing a semiconductor device, according to claim 2, wherein:
the forming the polyimide film comprises:
exhausting a superfluous carbon dioxide of the supercritical state remaining in the reaction chamber through an exhaust hole placed upwards of the substrate.

7. The method of manufacturing a semiconductor device, according to claim 6, wherein:
the forming the polyimide film comprises:
removing the polyamic acid from the carbon dioxide exhausted from the exhaust hole.

8. The method of manufacturing a semiconductor device, according to claim 2, wherein:
the forming the polyimide film comprises:
maintaining constant, both a concentration of the diamine monomer dissolved within the carbon dioxide in the supercritical state and a concentration of the tetracarboxylic acid dianhydride monomer dissolved within the carbon dioxide in the supercritical state; and
continuously supplying and exhausting the carbon dioxide in the supercritical state so that a flow rate of the carbon dioxide in the supercritical state is kept constant.

9. The method of manufacturing a semiconductor device, according to claim 2, further comprising:
heating the substrate at a temperature not lower than a temperature at which imidization is caused to occur, after the polyimide film is formed.

10. The method of manufacturing the semiconductor device, according to claim 2, wherein the substrate is a stacked substrate which has a plurality of semiconductor substrates stacked to each other through bumps;
wherein:
a lowermost one of the semiconductor substrates has through holes.

11. The method of manufacturing a semiconductor device, according to claim 2, further comprising:
preparing the substrate before the substrate is placed within the reaction chamber; and
grinding the substrate after the polyimide film is formed;
wherein the preparing the substrate comprises:
stacking a first substrate and a second substrate through bumps;
wherein the forming the polyimide film comprises:
forming the polyimide film so that a gap between the first and the second substrates is filled;
wherein the grinding the substrate comprises:
reducing a thickness of the substrate by grinding the second substrate; and
forming bumps on a ground surface of the second substrate.

12. The method of manufacturing a semiconductor device, according to claim 2, comprising:
dissolving the diamine monomer and the tetracarboxylic acid dianhydride monomer within the carbon dioxide in the supercritical state containing an aprotic polarity solvent as a co-solvent.

13. The method of manufacturing a semiconductor device, according to claim 12, wherein the aprotic polarity solvent is any one of N,N-dimethylformamide, N,N-dimethylacetamide, N-methylpyrrolidone, N-methyl-2-pyrrolidone, hexamethylphosphoramide, 1,3-dimethylimidazolidinone, tetramethylurea, 1,3-dipropylimidazolidinone, N-methyl caprolactam, dimethyl sulfoxide, dimethyl sulfone, tetramethyl sulfone, acetone, and ethylene glycol, or a mixture of at least two thereof.

14. The method of manufacturing a semiconductor device, according to claim 2, comprising:
keeping an atmospheric temperature within the reaction chamber at a temperature which is not lower than 35° C. and is not higher than 100° C.;
keeping a pressure within the reaction chamber at a pressure which is not lower than 10 MPa and which is not higher than 40 MPa; and
keeping the temperature of the substrate surface at a temperature which is not lower than 150° C. and which is not higher than 500° C.

15. The method of manufacturing a semiconductor device, according to claim 2, wherein:
the diamine monomer is 4,4'-diaminodiphenylether while the tetracarboxylic acid dianhydride monomer is pyromellitic acid dianhydride.

* * * * *